(12) United States Patent
Reznicek et al.

(10) Patent No.: US 10,312,438 B1
(45) Date of Patent: Jun. 4, 2019

(54) RESISTIVE MEMORY WITH AMORPHOUS SILICON FILAMENTS

(71) Applicant: International Business Machines Corporation, Armonk, NY (US)

(72) Inventors: Alexander Reznicek, Troy, NY (US); Bahman Hekmatshoartabari, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/845,830

(22) Filed: Dec. 18, 2017

(51) Int. Cl.
*H01L 45/00* (2006.01)
*H01L 27/24* (2006.01)
*H01L 23/528* (2006.01)

(52) U.S. Cl.
CPC .......... *H01L 45/085* (2013.01); *H01L 23/528* (2013.01); *H01L 27/2463* (2013.01); *H01L 45/1233* (2013.01); *H01L 45/1266* (2013.01); *H01L 45/148* (2013.01); *H01L 45/1616* (2013.01); *H01L 45/1641* (2013.01); *H01L 45/1675* (2013.01); *H01L 27/2409* (2013.01)

(58) Field of Classification Search
CPC ................. H01L 45/16; H01L 45/1675; H01L 21/02683–21/02686; H01L 21/02675; H01L 27/2409; H01L 27/1021; H01L 27/224; H01L 29/861; H01L 29/6609; H01L 29/66121; H01L 45/00; G11C 2213/72; G11C 17/16; G11C 17/06
See application file for complete search history.

(56) References Cited

U.S. PATENT DOCUMENTS

| | | | |
|---|---|---|---|
| 6,777,773 B2 | 8/2004 | Knall | |
| 9,246,089 B2 | 1/2016 | Herner et al. | |
| 2012/0210932 A1 | 8/2012 | Hekmatshoar-Tabari et al. | |
| 2012/0289020 A1* | 11/2012 | Kim ........................ | H01L 45/04 438/382 |
| 2012/0305879 A1* | 12/2012 | Lu .......................... | H01L 27/101 257/4 |
| 2013/0134383 A1* | 5/2013 | Hwang .................... | H01L 45/16 257/5 |

(Continued)

OTHER PUBLICATIONS

M. Johnson et al., "512-Mb PROM with a Three-Dimensional Array of Diode/Antifuse Memory Cells," IEEE Journal of Solid-State Circuits, Nov. 2003, pp. 1920-1928, vol. 38, No. 11.

(Continued)

*Primary Examiner* — Frederick B Hargrove
(74) *Attorney, Agent, or Firm* — L. Jeffrey Kelly; Ryan, Mason & Lewis, LLP

(57) ABSTRACT

A method for manufacturing a semiconductor memory device includes forming a first silicon layer on a bottom conductive layer, transforming the first silicon layer into a first polysilicon layer, forming a second silicon layer stacked on the first polysilicon layer, and a third silicon layer stacked on the second silicon layer, transforming the second and third silicon layers into second and third polysilicon layers, wherein the first and third polysilicon layers have a first doping type, and the second polysilicon layer has a second doping type different from the first doping type, forming an amorphous silicon layer on the third polysilicon layer, and forming a top conductive layer on the amorphous silicon layer.

16 Claims, 18 Drawing Sheets

(56) References Cited

U.S. PATENT DOCUMENTS

2014/0284540 A1* 9/2014 Suguro .............. H01L 45/085
257/4

OTHER PUBLICATIONS

M. Crowley et al., "512Mb PROM with 8 Layers of Antifuse/Diode Cells," IEEE International Solid-State Circuits Conference (ISSCC), Paper 16.4, Feb. 13, 2003, 10 pages.
V.S.S. Srinivasan, et al., "Punchthrough-Diode-Based Bipolar RRAM Selector by Si Epitaxy", IEEE Electric Device Letters, Oct. 2012, vol. 33, No. 10.
M.H. Lee, et al., "Reliability of Ambipolar Switching Poly-Si Diodes for Cross-Point Memory Applications", Device Research Conference (DRC) 2011, 69th Annual.
S.H. Jo, et al., "CMOS Compatible Nanoscale Nonvolatile Resistance Switching Memory", Nano Letters, Feb. 2008, pp. 392-397, vol. 8, No. 2.
Y. Dong, et al., "Si/a-Si Core/Shell Nanowires as Nonvolatile Crossbar Switches", Nano Letters, Feb. 2008, pp. 386-391, vol. 8, No. 2.
Wikipedia, "3D XPoint," https://en.wikipedia.org/wiki/3D_XPoint, 2017, 3 pages.
Crossbar, "Crossbar ReRAM: Rethinking Simplicity.," https://www.crossbar-inc.com/en/technology/reram-overview/, 4 Pages.
G.W. Burr et al., "Access Devices for 3D Crosspoint Memory.," Journal of Vacuum Science & Technology B, Nanotechonology and Microelectronics: Materials, Processing, Measurement, and Phenomena, Jul./Aug. 2014, vol. 32, No. 4, 23 pages.
K. Suga et al., "P-3: The Effect of a Laser Annealing Ambient on the Morphology and TFT Performance of Poly-Si Films," Society for Information Display, vol. 31, No. 1, May 2000, pp. 534-537.
R.F. Wood et al., "Macroscopic Theory of Pulsed-Laser Annealing II. Dopant Diffusion arid Segregation," The American Physical Society, vol. 23, No. 10, May 15, 1981, pp. 5555-5569.
K. Oh et al., "Bottom-Gate ELA Poly-Si TFT for High-Resolution AMOLED Mobile Displays," Society for Information Display, vol. 47, No. 1, May 22, 2016, pp. 923-926.
Y. Chen et al., "P-4: Fabrication of Extremely Low Roughness Polycrystalline Silicon and Its Correlation to Device Performance," Society for Information Display, vol. 34. No. 1, May 2003, pp. 216-219.
D. Shahrjerdi et al., "Low-Temperature Epitaxy of Compressively Strained Silicon Directly on Silicon Substrates," Journal of Electronic Materials, vol. 41, No. 3, 2012, pp. 494-497.
F. Carta et al., "Sequential Lateral Solidification of Silicon Thin Films on Cu BEOL-Integrated Wafers for Monolithic 3-D Integration," IEEE Transactions on Electron Devices, vol. 62, No. 11, Nov. 2015, pp. 3387-3391.

* cited by examiner

D-D'

E-E'

F-F'

G-G'

ON

OFF

500

H-H'

I-I'

J-J'

K-K'

L-L'

M-M'

N-N'

O-O'

P-P'

Q-Q'

R-R'

S-S'

RESISTIVE MEMORY WITH AMORPHOUS SILICON FILAMENTS

BACKGROUND

Memory cells may include, for example, phase-change random-access memory (PCRAM), resistive random-access memory (RRAM or ReRAM), magnetic random-access memory (MRAM), and/or fuse/anti-fuse devices. Selector devices may include, for example, diodes (e.g., unipolar or bipolar), and other 2-terminal (e.g., ovonic threshold switch (OTS)) or 3-terminal devices (e.g. field-effect transistors (FETs) and bipolar junction transistors (BJTs)).

RRAM devices have a three-layer structure of a top electrode, switching medium and bottom electrode. A resistance switching mechanism utilizes a filament formed in the switching material upon application of a voltage to the two electrodes. With RRAM technology, a silicon-based switching material can be used for metallic filament formation. For example, filamental resistive memory has been demonstrated with amorphous silicon/crystalline silicon (a-Si/c-Si) heterojunctions.

RRAM devices can be stacked in a three-dimensional (3D) configuration. Commercially available 3D RRAM devices include Crossbar™ ReRAM, from Crossbar, Inc. of Santa Clara, Calif., and 3D XPoint™, from Intel Corporation of Santa Clara, Calif. Storage in the 3D RRAM devices is based on resistance changes in a stackable cross-gridded data access array.

Back-end-of-line (BEOL) requirements for selector devices to enable 3D stacking can include, for example, selector device fabrication temperatures below ~400° C. to prevent damage to BEOL metal lines, and after fabrication, selector devices being able to withstand temperatures of ~400° C., which may be the metallization temperature of upper layers.

There is a need for resistive memory devices, such as RRAM and 3D RRAM, and methods of fabricating same, which are compatible with BEOL structures and techniques.

SUMMARY

According to an exemplary embodiment of the present invention, a method for manufacturing a semiconductor device includes forming a first silicon layer on a bottom conductive layer, transforming the first silicon layer into a first polysilicon layer, forming a second silicon layer stacked on the first polysilicon layer, and a third silicon layer stacked on the second silicon layer, transforming the second and third silicon layers into second and third polysilicon layers, wherein the first and third polysilicon layers have a first doping type, and the second polysilicon layer has a second doping type different from the first doping type, forming an amorphous silicon layer on the third polysilicon layer, and forming a top conductive layer on the amorphous silicon layer.

According to an exemplary embodiment of the present invention, a semiconductor device includes a plurality of wordlines spaced apart from each other, a plurality of stacked structures spaced apart from each other and formed on each wordline of the plurality of wordlines, and a plurality of bitlines spaced apart from each other and formed on the plurality of stacked structures, wherein the plurality of bitlines are oriented perpendicularly with respect to the plurality of wordlines. Each of the plurality of stacked structures includes a first polysilicon layer on a wordline of the plurality of wordlines, a second polysilicon layer on the first polysilicon layer, a third polysilicon layer on the second polysilicon layer, and an amorphous silicon layer on the third polysilicon layer, wherein the first and third polysilicon layers have a first doping type, and the second polysilicon layer has a second doping type different from the first doping type.

According to an exemplary embodiment of the present invention, a method for manufacturing a semiconductor device includes forming a first silicon layer on a bottom conductive layer, crystallizing the first silicon layer, forming a second silicon layer stacked on the crystallized first silicon layer, and a third silicon layer stacked on the second silicon layer, crystallizing the second and third silicon layers, wherein the crystallized first and third silicon layers have a first doping type, and the crystallized second silicon layer has a second doping type different from the first doping type, forming an amorphous silicon layer on the crystallized third silicon layer, and forming a top conductive layer on the amorphous silicon layer.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1A:
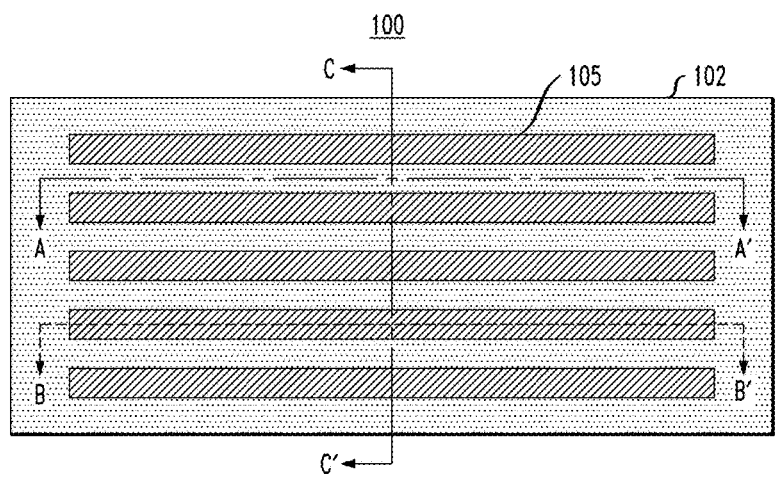
FIG. 1A is a schematic top view illustrating manufacturing of a memory device and showing wordlines and a second dielectric layer formed on a first dielectric layer, according to an embodiment of the invention.

Exemplary embodiments of the invention will now be discussed in further detail with regard to semiconductor devices and methods of manufacturing same and, in particular, to forming BEOL compatible memory devices in a 3D stacked structure.

It is to be understood that the various layers and/or regions shown in the accompanying drawings are not drawn to scale, and that one or more layers and/or regions of a type commonly used in, for example, phase-change random-access memory (PCRAM), resistive random-access memory (RRAM or ReRAM), three-dimensional (3D) RRAM, magnetic random-access memory (MRAM), fuse/anti-fuse, diode, ovonic threshold switch (OTS), bipolar junction transistor (BJT), complementary metal-oxide semiconductor (CMOS), field-effect transistor (FET), nanowire FET, nanosheet FET, fin field-effect transistor (FinFET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, PCRAM, RRAM, 3D RRAM, MRAM, fuses/antifuses, diodes, OTSs, BJTs, FETs, CMOSs, MOSFETs, nanowire FETs, nanosheet FETs and/or FinFETs. By way of non-limiting example, the semiconductor devices can include, but are not limited to PCRAM, RRAM, 3D RRAM, MRAM, fuse/anti-fuse, diode, OTS, BJT, FET, CMOS, MOSFET, nanowire FET, nanosheet FET and FinFET devices, and/or semiconductor devices that use PCRAM, RRAM, 3D RRAM, MRAM, fuse/anti-fuse, diode, OTS, BJT, FET, CMOS, MOSFET, nanowire FET, nanosheet FET and/or FinFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

As used herein, "low-k" refers to dielectric materials having a relative dielectric constant less than 7, and includes ultra-low-k dielectric materials.

As used herein, "high-k" refers to dielectric materials having a relative dielectric constant greater than 7.

As used herein, a "3D cross-point" or "3D cross-bar" structure includes a three-dimensional configuration of memory cells at the intersection of wordlines and bitlines. In the structure, each of the memory cells can be addressed individually, so that data can be written and read in small sizes. As described further herein, each memory cell includes a memory element and a selection device, such as, e.g., a diode or OTS. The structures of the memory cells intersecting wordlines and bitlines is stacked two or more.

Embodiments of the present invention relate to methods and structures to form BEOL compatible semiconductor devices. In accordance with an embodiment of the present invention, amorphous silicon (or nano- or micro crystalline) layers are crystallized to form polysilicon diodes for memory cells in a memory array. More specifically, amorphous silicon layers (or nano- or micro crystalline) are crystallized at relatively low temperatures (e.g., less than ~400° C.) using, for example, laser crystallization (e.g., excimer laser anneal (ELA)). Due to short laser pulses, local heating and fast dissipation, a-Si (or nano- or micro crystalline) can be crystallized at low temperatures.

In addition, in accordance with embodiments of the present invention, in order to enable 3D stacking, such as, for example, in connection with 3D RRAM devices, the restive memory elements and the diodes are back-end compatible. Structures and methods of the embodiments of the present invention enable BEOL compatible memory devices in a 3D stacked structure.

Figure 1B:
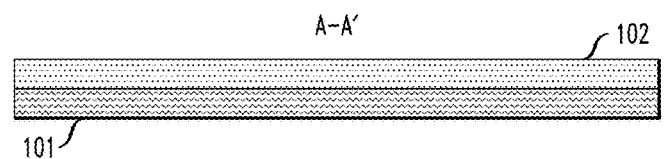
FIGS. 1B, 1C and 1D are schematic cross-sectional views taken along the lines A-A', B-B' and C-C' in FIG. 1A and showing the patterned wordlines and/or the second dielectric layer formed on the first dielectric layer, according to an embodiment of the invention.
Figure 1C:
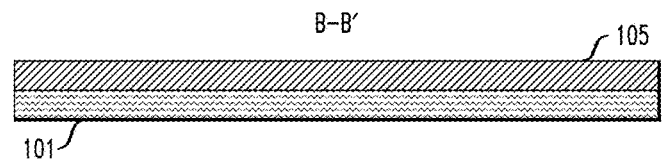
Figure 1D:
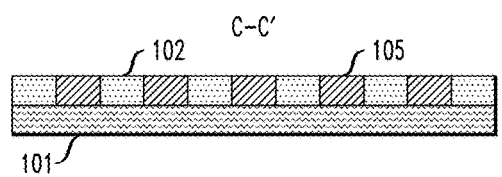

FIG. 1A is a schematic top view, and FIGS. 1B, 1C and 1D are schematic cross-sectional views taken along the lines A-A', B-B' and C-C' in FIG. 1A. FIGS. 1A-1D show patterned wordlines and/or a second dielectric layer formed on a first dielectric layer, according to an embodiment of the invention. Referring to FIGS. 1A-1D, in connection with a device 100, a plurality of wordlines 105 are formed to be spaced apart from each other on a first dielectric layer 101. In addition, as shown in FIGS. 1B and 1D, a second dielectric layer 102 is formed on the first dielectric layer 101 and in the spaces between the wordlines 105.

The material of the first and second dielectric layers 101, 102 can include, but is not necessarily limited to, a low-K dielectric material, such as, for example, silicon oxide, silicon nitride, silicon oxynitride, boron nitride, and/or silicon boron nitride. The dielectric layers 101, 102 are deposited using deposition techniques such as, for example, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), and/or sputtering, which may be followed by a planarization process, such as, chemical mechanical polishing (CMP), to remove excess portions of the layers 101, 102 after deposition.

The material of the wordlines 105 can include an electrically conductive material, such as, but not necessarily limited to, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides or combinations thereof. The wordlines 105 can be deposited using, for example, CVD, PECVD, RFCVD, PVD, ALD, MLD, MBD, PLD, LSMCD, and/or sputtering, followed by planarization by, for example, CMP. The wordlines 105 can be patterned to be spaced apart from each other, using, for example, photolithography and reactive ion etching (ME) which may optionally include a dielectric hard mask such as oxide or nitride.

Figure 2A:
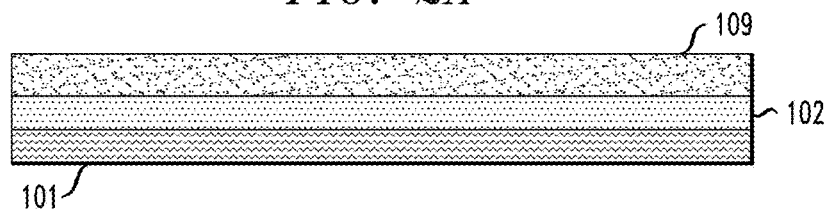
FIGS. 2A, 2B and 2C are schematic cross-sectional views illustrating manufacturing of a memory device and showing formation of highly doped amorphous silicon (a-Si) on the structures of FIGS. 1B-1D, according to an embodiment of the invention.
Figure 2B:
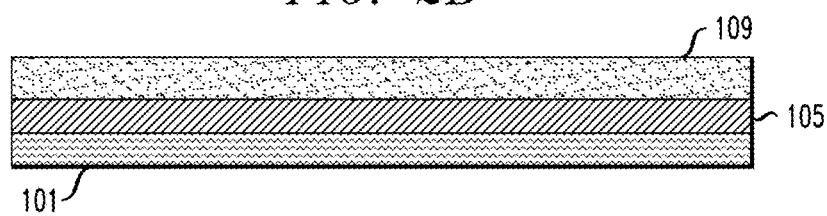
Figure 2C:
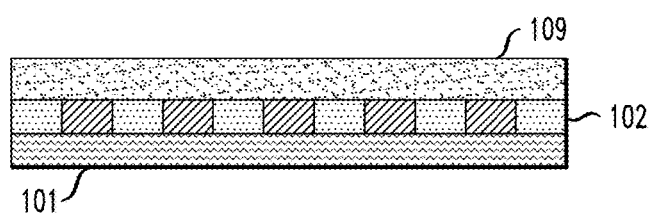

FIGS. 2A, 2B and 2C are schematic cross-sectional views illustrating manufacturing of a memory device and showing formation of highly doped amorphous silicon (a-Si) on the structures of FIGS. 1B-1D, according to an embodiment of the invention. Referring to FIGS. 2A-2C, which are cross-sections taken along lines similar to lines A-A', B-B' and C-C', building on the structures from FIGS. 1B-1D, a highly doped a-Si layer 109 is formed on the wordlines 105 and/or the second dielectric layer 102. In accordance with an embodiment of the present invention, the a-Si layer 109 is $p^{++}$ doped (or $p^+$ doped), and is doped with, for example, boron (B) at a total (i.e. active and/or inactive) concentration in the general range of $10^{20}/cm^3$-$10^{21}/cm^3$. As explained herein below, a stacked p-n-p structure is formed. Alternatively, an n-p-n structure is formed, where the a-Si layer 109 is $n^{++}$ (or $n^+$) doped, and is doped with, for example, arsenic (As) or phosphorus (P) at a total concentration in the general range of $10^{20}/cm^3$-$10^{21}/cm^3$. A thickness (e.g., height with respect to the underlying layer) of the highly doped a-Si layer 109 can be approximately 5 nm-25 nm, but thinner or thicker layers may be used as well. The a-Si layer can be deposited using, for example CVD, PECVD, RFCVD, hot-wire CVD (HWCVD), PVD, ALD, MLD, MBD, PLD, LSMCD, and/or sputtering. The percentage of the active doping concentration in a-Si may be, for example, in the range of 1-10%. The a-Si layer may be doped in-situ during deposition (e.g. with dopant gases introduced in the gas mixture in CVD-based techniques, or using a doped solid target in PVD-based techniques) or introduced after deposition, e.g. using ion-implantation. The a-Si films may contain elements such as, e.g. hydrogen (H), helium (He), argon (Ar), nitrogen (N), germanium (Ge) and carbon (C) which may be incorporated into the film, e.g. from precursor gases and/or carrier gases during growth.

Figure 3A:
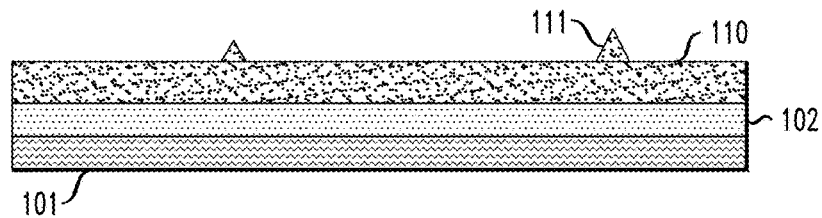
FIGS. 3A and 3B are schematic cross-sectional views illustrating manufacturing of a memory device and showing transformation of the highly doped a-Si to polysilicon, according to an embodiment of the invention.
Figure 3B:
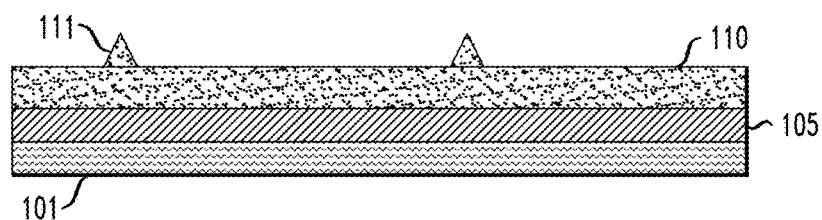

FIGS. 3A and 3B are schematic cross-sectional views illustrating manufacturing of a memory device and showing transformation of the highly doped a-Si to polysilicon, according to an embodiment of the invention. In general, FIGS. 3A-3B, 4A-4B, 5A-5B, 6A-6B, and 7A-7B are cross-sections taken along lines similar to lines A-A' and B-B', and working from the structures in previous figures.

Referring to FIGS. 3A-3B, the a-Si layer 109 is crystallized into a polysilicon layer 110 using, for example, laser crystallization, such as ELA, which can be performed at a temperature of less than ~400° C. Laser pulses with short durations generate local heat which may be efficiently dissipated, allowing to maintain the substrate at temperatures as low as room temperature (or lower than room temperature if substrate cooling is used). The polysilicon layer 110 has the same doping type and about the same doping concentration as the a-Si layer 109. A small portion of dopant species may escape from the surface in gaseous form during crystallization; however, the percentage of active doping may substantially improve after crystallization, e.g., from 1-10% to over 95%. During the laser annealing process, surface protrusions 111 (also referred to as surface spikes) may be formed on the surface of the resulting polysilicon layer 110. Some preparation methods and/or conditions (e.g., one-shot ELA), may result in surface protrusions at grain-boundary locations.

In one example, the excimer laser energy density (fluence) is in the range of 350 mJ/cm$^2$-450 mJ/cm$^2$, the laser pulse width is in the range of 10 ns-50 ns and the repetition rate is in the range of 100 Hz-1 KHz. The number of laser pulses (shots) may be in range of 1-100, but a larger number of pulses may also be used. Other laser crystallization techniques known in the art, such as sequential lateral solidification (SLC) may also be used. In embodiments where a-Si contains volatile elements, such as H, Ar and He, a low-temperature thermal treatment (e.g. furnace anneal at 400° C.) or low-energy laser treatment (e.g. with fluence below 300 mJ/cm$^2$) may be performed before laser crystallization to substantially reduce the concentration of the volatile elements (e.g. to lower than 1%) in order to avoid explosive release of these elements (and therefore formation of voids) during laser crystallization.

Figure 4A:
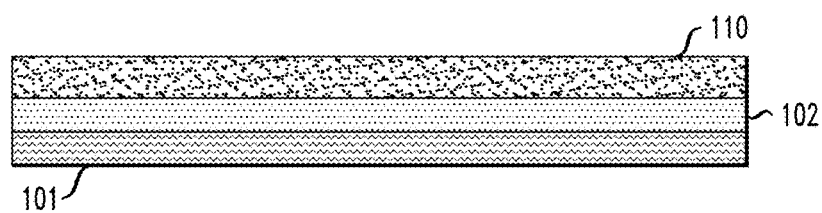
FIGS. 4A and 4B are schematic cross-sectional views illustrating manufacturing of a memory device and showing removal of surface spikes formed as a result of the transformation of the highly doped a-Si to polysilicon, according to an embodiment of the invention.
Figure 4B:
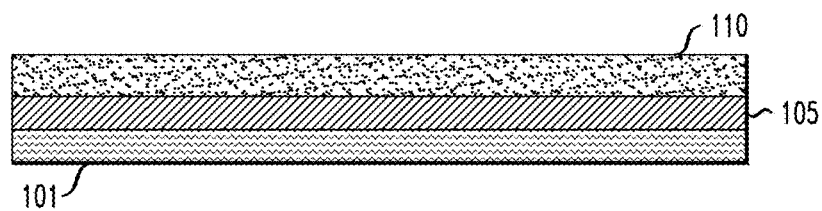

FIGS. 4A and 4B are schematic cross-sectional views illustrating manufacturing of a memory device and showing removal of surface spikes formed as a result of the transformation of the highly doped a-Si to polysilicon, according to an embodiment of the invention. Referring to FIGS. 4A-4B, the surface protrusions 111 may be removed, using chemical and/or mechanical methods, such as, for example, CMP.

Figure 5A:
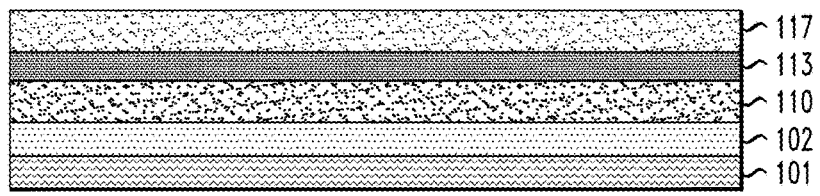
FIGS. 5A and 5B are schematic cross-sectional views illustrating manufacturing of a memory device and showing formation of layers of moderately and highly doped silicon, according to an embodiment of the invention.
Figure 5B:
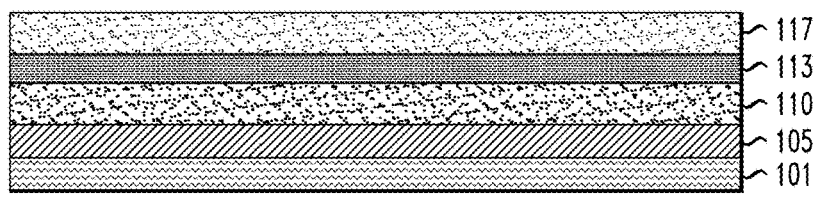

FIGS. 5A and 5B are schematic cross-sectional views illustrating manufacturing of a memory device and showing formation of layers of moderately and highly doped silicon, according to an embodiment of the invention. Referring to FIGS. 5A-5B, moderately and highly doped silicon layers 113 and 117 are formed on the highly doped polysilicon layer 110. In accordance with an embodiment of the present invention, $n^+$ (or n) and $p^{++}$ (or $p^+$) polycrystalline Si layers 113 and 117 are grown epitaxially (i.e. following the crystalline structure of the polysilicon layer 110) using low-temperature techniques such as PECVD and HWCVD; or a-Si, nano-crystalline silicon (nc-Si), or micro-crystalline silicon (μc-Si) layers 113, 117 are deposited non-epitaxially using techniques, such as, for example, CVD, PECVD, HWCVD, RFCVD, PVD, ALD, MLD, MBD, PLD, LSMCD, and/or sputtering; and converted into polysilicon after deposition, e.g. by laser crystallization (see, e.g., FIGS. 6A-6B). The conversion into polysilicon may be epitaxial (i.e. layers 113 and 117 follow the crystalline structure of the polysilicon layer 110 during crystallization) or may be non-epitaxial (i.e. layers 113 and 117 do not follow the crystalline structure of the polysilicon layer 110 during crystallization).

Low-temperature epitaxial growth of the highly doped and moderately doped layers 113, 117 may be performed using plasma-enhanced chemical vapor deposition (PECVD) at temperatures below ~400° C., such as, 150° C.-350° C., in some embodiments. The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In a low-temperature epitaxial deposition process, the system parameters are set such that the carrier (e.g. hydrogen) radicals present in the gas mixture selectively remove the weak atomic bonds formed on the growth surface (which would otherwise result in non-crystalline growth) thus resulting in a semiconductor material that has substantially the same crystalline characteristics as the deposition surface on which the epitaxially grown material is formed. In one example, a mixture of $SiH_4$ (silane) and $H_2$ (hydrogen) gases with a gas flow ratio of $[H_2]/[SiH_4]>5$ is used for PECVD epitaxy and the resulting epitaxial polysilicon layer contains between 5-40% hydrogen. The system parameters may be set (e.g. $[H_2]/[SiH_4]<5$) such that the growth is non-epitaxial, i.e., resulting in hydrogenated a-Si, µc-Si or The epitaxial deposition process may employ the deposition chamber of a plasma-enhanced chemical vapor deposition (PECVD) apparatus where plasma may be generated from a DC source, an RF source or very-high-frequency (VHF) source; or a hot-wire chemical vapor deposition (HWCVD) apparatus. A number of different sources may be used for the epitaxial deposition of an in situ doped semiconductor material. In some embodiments, the gas source for the deposition of an epitaxially formed in situ doped semiconductor material may include silicon (Si) deposited from silane, disilane, trisilane, tetrasilane, hexachlorodisilane, tetrachlorosilane, dichlorosilane, trichlorosilane, ldisilane and combinations thereof. By "in-situ", it is meant that the dopant that dictates the conductivity type of the doped layer is introduced during the process step, e.g., epitaxial deposition, that forms the doped layer. Dopant gases used for n-type doping may include, e.g., phosphine ($PH_3$) and arsine ($AsH_3$), and the dopant gases used for p-type doping may include, e.g., diborane ($B_2H_6$) or Trimethylborane ($B(CH_3)_3$, also known as TMB).

In accordance with an embodiment of the present invention, the layer 113 is $n^+$ (or n) doped, and is doped with, for example, arsenic (As) or phosphorous (P) at a concentration in the general range of $5\times10/cm^3$-$5\times10^{19}/cm^3$, and the layer 117 is $p^{++}$ doped (or $p^+$ doped), and is doped with, for example, boron (B) at a concentration in the general range of $5\times10^{18}/cm^3$-$5\times10^{19}/cm^3$. As explained herein, a stacked p-n-p structure is formed. Alternatively, an n-p-n structure is formed, where the layer 113 is $p^+$ (or p) doped, and the layer 117 is $n^{++}$ (or $n^+$) doped. A thickness (e.g., height with respect to the underlying layer) of the layer 113 and 117 can be approximately 3-15 nm, but thicker or thinner layers may be used as well.

Figure 6A:
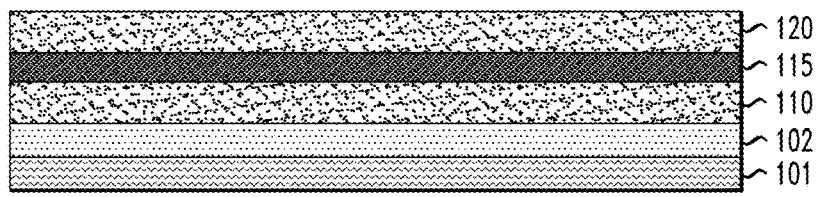
FIGS. 6A and 6B are schematic cross-sectional views illustrating manufacturing of a memory device and showing transformation of the layers of moderately and highly doped Si to polysilicon, according to an embodiment of the invention.
Figure 6B:
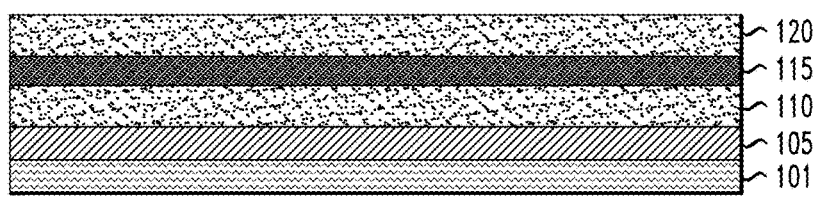

FIGS. 6A and 6B are schematic cross-sectional views illustrating manufacturing of a memory device and showing transformation of the layers of moderately and highly doped Si to polysilicon, according to an embodiment of the invention. Referring to FIGS. 6A-6B, a-Si, nano-crystalline silicon (nc-Si), or micro-crystalline silicon (µc-Si) layers 113, 117 are crystallized to result in moderately and highly doped polysilicon layers 115 and 120. Similar to what is described in connection with FIGS. 3A and 3B, laser crystallization, such as ELA, which can be performed at a temperature of less than ~400° C. to transform the layers 113, 117 into polysilicon layers 115, 120. The polysilicon layers 115, 120 have the same doping as the layers 113, 117, but the doping activation may improve during crystallization. Although not shown, like the surface protrusions 111 discussed in connection with FIGS. 3A and 3B, surface protrusions may be formed on the surface of the resulting polysilicon layer 120 as a result of a laser annealing process, which can be removed using chemical and/or mechanical methods, such as, for example, CMP.

In embodiments where layers 113 and 117 are grown epitaxially and therefore are polycrystalline after growth, a laser treatment step may be optionally performed to improve the crystallinity (e.g. reduce the crystal defects) and/or increase doping activation in layers 113 and 117. Other treatments generally known to improve crystallinity, increase doping activation and/or passivate dangling bonds, such as, e.g., rapid thermal annealing (RTA), forming gas anneal (FGA) and flash lamp anneal, may also be optionally used in conjunction with laser crystallization or laser treatment, so far as the treatment temperature is maintained below ~400° C.

Figure 7A:
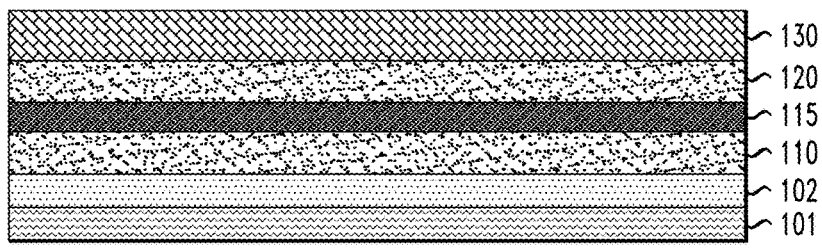
FIGS. 7A and 7B are schematic cross-sectional views illustrating manufacturing of a memory device and showing formation of a-Si on the upper polysilicon layer from FIGS. 6A and 6B, according to an embodiment of the invention.
Figure 7B:
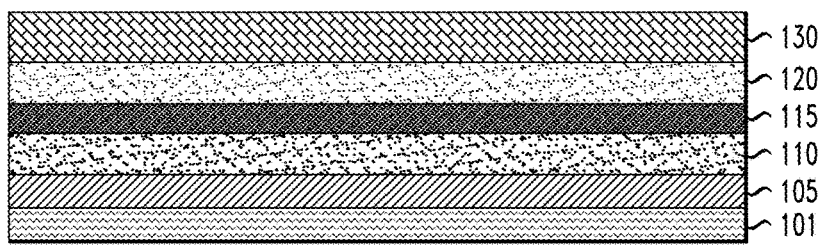

FIGS. 7A and 7B are schematic cross-sectional views illustrating manufacturing of a memory device and showing formation of a-Si on the upper polysilicon layer from FIGS. 6A and 6B, according to an embodiment of the invention. Referring to FIGS. 7A-7B, an a-Si layer 130 is formed on the upper polysilicon layer 120 of the stack including the polysilicon layers 110, 115 and 120. In accordance with an embodiment of the present invention, a thickness (e.g., height with respect to the underlying layer) of the a-Si layer 130 can be approximately 3-25 nm, but thicker or thinner layers may be used as well. The a-Si layer 130 can be deposited using, for example CVD, PECVD, RFCVD, HWCVD, PVD, ALD, MLD, MBD, PLD, LSMCD, and/or sputtering.

Figure 8A:
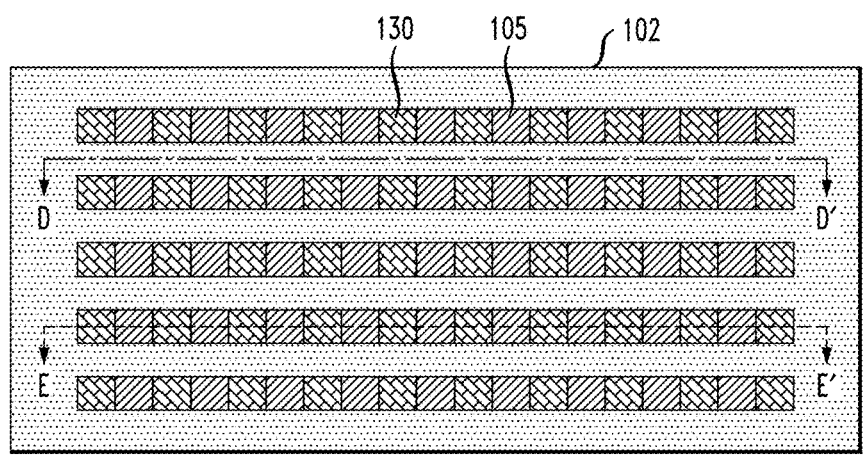
FIG. 8A is a schematic top view illustrating manufacturing of a memory device and showing patterning of the stacked a-Si and polysilicon layers into pillars on the wordlines, according to an embodiment of the invention.
Figure 8B:
FIGS. 8B and 8C are schematic cross-sectional views taken along the lines D-D' and E-E' in FIG. 8A and showing the patterned stacked a-Si and polysilicon layers and the second dielectric layer formed on the first dielectric layer, according to an embodiment of the invention.
Figure 8C:
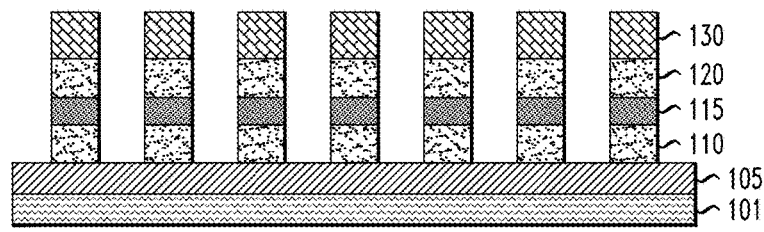

FIG. 8A is a schematic top view, and FIGS. 8B and 8C are schematic cross-sectional views taken along the lines D-D' and E-E' in FIG. 8A showing the patterned stacked a-Si and polysilicon layers and the second dielectric layer formed on the first dielectric layer, according to an embodiment of the invention. Referring to FIGS. 8A-8C, the stacks including the a-Si layer 130 on the stacked polysilicon layers 110, 115 and 120 are patterned using an etching process, such as, for example, reactive ion etching (RIE) to result in pillar/columnar structures spaced apart from each other on the wordlines 105, each columnar structure including layers 130, 120, 115 and 110 in descending order. As can be understood, according to an embodiment, the polysilicon layers 110, 115 and 120 are $p^{++}$, $n^+$ and $p^{++}$ doped (or $p^+$, n and $p^+$ doped), respectively. Alternatively, the polysilicon layers 110, 115 and 120 are $n^{++}$, $p^+$ and $n^{++}$ doped (or $n^+$, p and $n^+$ doped), respectively. The etch can be performed using, such as, e.g., an $SF_6/O_2$ plasma, $SF_6/CHF_3$ plasma or $CF_4$ plasma, and an optional hard mask, such as, e.g., silicon nitride, formed on the a-Si layer 130 in order to mask portions of the stacked structures including layers 130, 120, 115 and 110 not being etched, and expose remaining portions of the stacked structures that are to be etched.

Figure 9A:
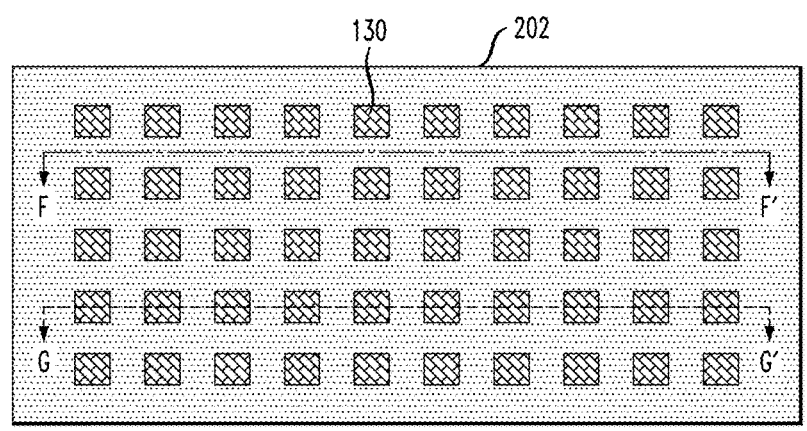
FIG. 9A is a schematic top view illustrating manufacturing of a memory device and showing dielectric deposition and planarization on the structure from FIGS. 8A-8C, according to an embodiment of the invention.
Figure 9B:
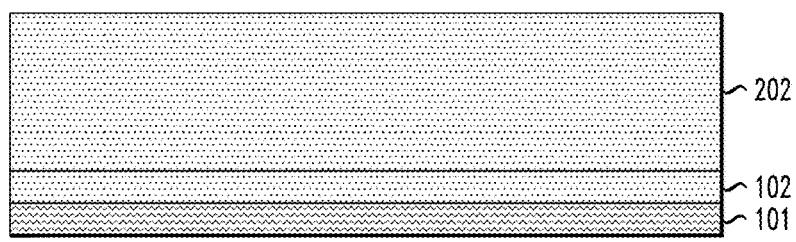
FIGS. 9B and 9C are schematic cross-sectional views taken along the lines F-F' and G-G' in FIG. 9A and showing dielectric deposition and planarization on the structure from FIGS. 8A-8C, according to an embodiment of the invention.
Figure 9C:
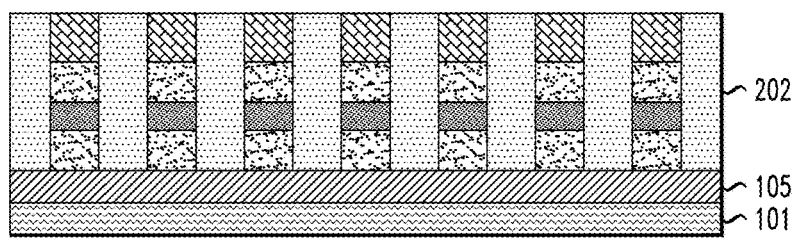

FIG. 9A is a schematic top view, and FIGS. 9B and 9C are schematic cross-sectional views taken along the lines F-F' and G-G' in FIG. 9A showing dielectric deposition and planarization on the structure from FIGS. 8A-8C, according to an embodiment of the invention. Referring to FIGS. 9A-9C, another dielectric layer 202 is formed on the second dielectric layer 102 and on the wordlines 105 in the spaces between the patterned stacked structures including the layers 110, 115, 120 and 130. The material of the dielectric layer 202 can include, but is not necessarily limited to, a low-K dielectric material, such as, for example, silicon oxide, silicon nitride, silicon oxynitride, boron nitride, and/or silicon boron nitride. The dielectric layer 202 is deposited using deposition techniques such as, for example, CVD, PECVD, RFCVD, PVD, ALD, MBD, PLD, and/or LSMCD, and/or sputtering, which may be followed by a planarization process, such as, CMP, to remove excess portions of the layer 202 after deposition, and planarize the layer 202 to be coplanar with the a-Si layers 130 at the top of the stacked structures.

Figure 10A:
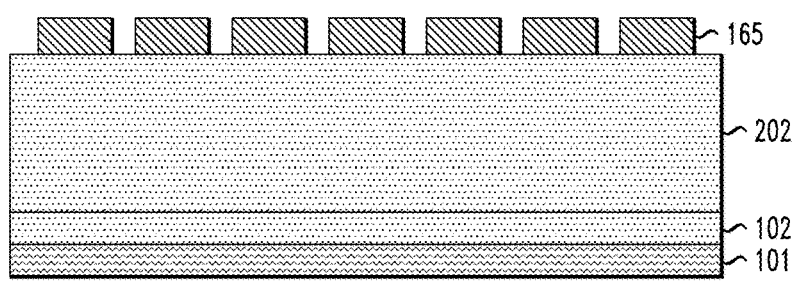
FIGS. 10A and 10B are schematic cross-sectional views showing bitline formation on the dielectric formed in connection with FIGS. 9A-9C, according to an embodiment of the invention.
Figure 10B:
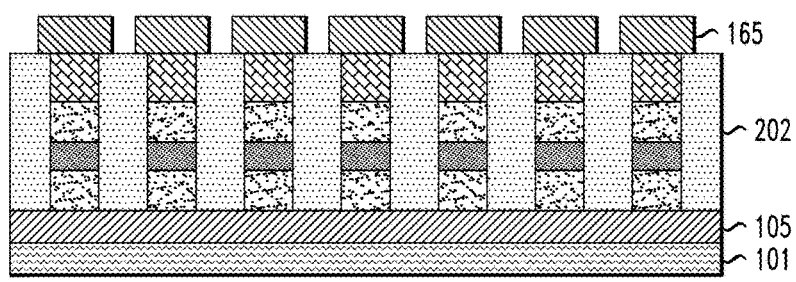

FIGS. 10A and 10B are schematic cross-sectional views showing bitline formation on the dielectric formed in connection with FIGS. 9A-9C, according to an embodiment of the invention. Referring to FIGS. 10A-10B, a plurality of bitlines 165 are formed on the dielectric layer 202 to be spaced apart from each other in positions corresponding to the stacked structures including layers 130, 120, 115 and 110. The bitlines 165 electrically contact their corresponding a-Si layers 130, and the wordlines 105 electrically contact the polysilicon layers 110. The bitlines 165 are oriented to have a length (longer dimension) extension direction which is perpendicular to the length (longer dimension) extension direction of the wordlines 105.

The material of the bitlines 165 can include an electrically conductive material, such as, but not necessarily limited to, tungsten, cobalt, zirconium, tantalum, titanium, aluminum, ruthenium, copper, silver, metal carbides (e.g., tantalum carbide, titanium carbide, tantalum magnesium carbide), metal nitrides (e.g., titanium nitride), transition metal aluminides or combinations thereof. The bitlines 165 can be deposited using, for example, CVD, PECVD, RFCVD, PVD, ALD, MLD, MBD, PLD, LSMCD, and/or sputtering, followed by planarization by, for example, CMP. In accordance with an embodiment of the present invention, a whole bitline layer is deposited and then patterned into individual portions that are spaced apart from each other. The bitlines 165 can be patterned to be spaced apart from each other, using, for example, photolithography and reactive ion etching (ME) which may optionally include a dielectric hard mask such as oxide or nitride.

Figure 11:
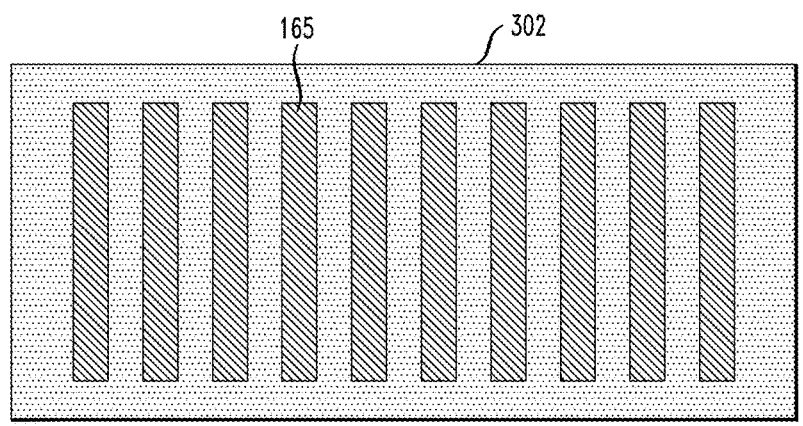
FIG. 11 is a schematic top view illustrating manufacturing of a memory device and showing dielectric deposition and planarization on the structure from FIGS. 10A-10B, according to an embodiment of the invention.

FIG. 11 is a schematic top view illustrating manufacturing of a memory device and showing dielectric deposition and planarization on the structure from FIGS. 10A-10B, according to an embodiment of the invention. Referring to FIG. 11, another dielectric layer 302 is formed on the dielectric layer 202 and in the spaces between the bitlines 165. The material of the dielectric layer 302 can include, but is not necessarily limited to, a low-K dielectric material, such as, for example, silicon oxide, silicon nitride, silicon oxynitride, boron nitride, and/or silicon boron nitride. The dielectric layer 302 is deposited using deposition techniques such as, for example, CVD, PECVD, RFCVD, PVD, ALD, MBD, PLD, and/or LSMCD, and/or sputtering, which may be followed by a planarization process, such as, CMP, to remove excess portions of the layer 302 after deposition, and planarize the layer 302 to be coplanar with the top surfaces of the bitlines 165.

In accordance with an embodiment of the present invention, the device 100 formed in connection with FIGS. 1A-11 is a resistive memory device configured in a cross-bar (also referred herein to as cross-point) structure, (e.g., RRAM), including resistive memory elements comprising the a-Si layers 130 coupled to bipolar (bidirectional) diodes (i.e., selection elements, also referred to as addressing elements) comprising the $p^{++}$, $n^+$ and $p^{++}$ (or $p^+$, n and $p^+$) polysilicon layers 110, 115 and 120. The $p^{++}$ or $p^+$ polysilicon layers 120 also serve as the bottom electrodes of the a-Si resistive memory elements comprising the a-Si layers 130. A resistive memory element and a corresponding selection diode coupled to it forms a resistive memory cell. The memory cells comprised of memory elements and diodes are interposed between top electrodes (e.g., bitlines 165) and bottom electrodes (e.g., wordlines 105) in a cross-bar structure. The bitlines 165 also serve as the top electrodes of the resistive memory elements comprising the a-Si layers 130. Multiple cross-bar structures comprised of wordlines, memory cells and bitlines as described above may be stacked on top of each other, thus forming a 3D stacked cross-bar structure. Each of the cross-bar structures comprising the 3D stacked cross-bar structure may be fabricated using the fabrication processes as described above with reference to the device 100.

Figure 12A:
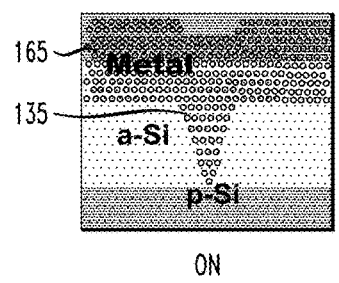
FIGS. 12A and 12B are schematic views illustrating creation and removal of a conductive path (e.g., conductive filament), respectively, according to an embodiment of the invention.
Figure 12B:
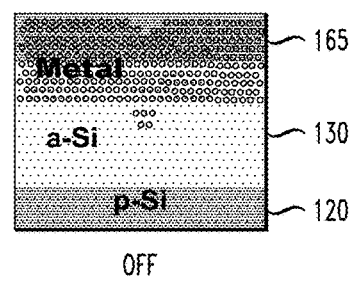

FIGS. 12A and 12B are schematic views illustrating creation and removal of a conductive path (e.g., conductive filament), respectively, in a resistive memory element comprising an a-Si layer, according to an embodiment of the invention. Referring to FIGS. 12A-12B, when a positive bias is applied to the bitline 165 with respect to the polysilicon layer 120 (in this case p-type), metal ions are driven into the a-Si layer 130 from the bitline 165 and create a conductive filament (conductive path) 135. This is the ON state of the memory element (and the ON state of the memory cell containing the memory element). When a negative bias is applied to bitline 165 with respect to the polysilicon layer 120, the metal ions are driven back from the a-Si layer 130 to the bitline 165 and the conductive filament (conductive path) 135 is removed. This is the OFF state of the memory element (and the OFF state of the memory cell containing the memory element).

Figure 13A:
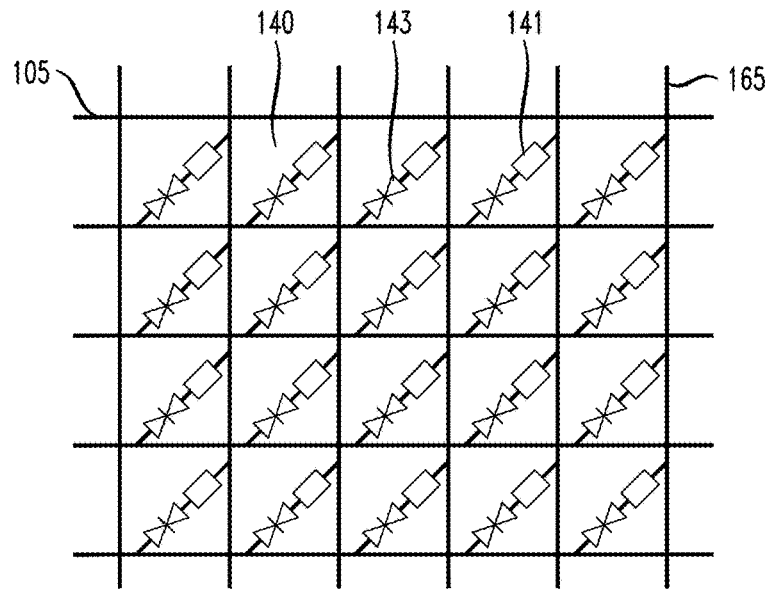
FIG. 13A is a circuit diagram of an array of memory cells including memory elements and bipolar diodes, according to an embodiment of the invention.

FIG. 13A is a circuit diagram of a cross-bar array of memory cells including memory elements and bipolar diodes, according to an embodiment of the invention. Referring to FIG. 13, each memory cell 140 in the array includes a memory element 141 and a bipolar (bidirectional) diode (i.e., selection element) 143. Multiple cross-bar arrays as illustrated in FIG. 13A can be stacked on top of each other to construct a stacked 3D configuration to form, for example, a 3D resistive random access memory (3D RRAM) device. In FIG. 13, the –□– symbol represents the memory element 141, and the –⋈– symbol represents the bipolar diode.

The vertical lines represent the bitlines 165 and the horizontal lines represent the wordlines 105. When a sufficiently positive program bias (sufficiently larger than the turn on voltage of the bipolar diode) is applied to a bitline 165 with respect to a wordline 105 of a memory cell 140, the bipolar diode 143 in that memory cell is turned on and transfers the positive bias to the memory element 141 in that memory cell. A positive bias is applied to the bitline 165 with respect to polysilicon layer 120 and a conductive path 135 is formed in the memory element 141 as described with respect to FIG. 12A. In this way, the memory cell 140 is programmed in the ON state. Similarly, when a sufficiently negative erase bias (sufficiently larger than the turn on voltage of the bipolar diode) is applied to a bitline 165 with respect to a wordline 105 of a memory cell 140, the bipolar diode 143 in that memory cell is turned on and transfers the negative bias to the memory element 141 in that memory cell. A negative bias is applied to the bitline 165 with respect to polysilicon layer 120 and the conductive path 135 is removed in the memory element 141 as described with respect to FIG. 12B. In this way, the memory cell 140 is programmed in the OFF state. The state of a memory cell may be accessed (sensed) without changing the state of the memory cell, by applying a sense (read) bias larger than the turn-on voltage of the bipolar diode, but smaller than the program and erase biases.

As noted herein above, the bipolar diodes can have an $n^{++}/p^+/n^{++}$, $n^+/p/n^+$, $p^{++}/n^+/p^{++}$, or $p^+/n/p^+$ structure. In a bipolar diode, if the applied voltage is larger than the turn-on voltage of the diode in either direction, the diode conducts in that direction. In a non-limiting example, in connection with a p++/n+/p++ structure, positive voltage applied to one of the electrodes will initially drop across the reverse-biased p++/n+ junction closer to that electrode. At higher voltages, the nonzero electric field within the middle n+ region lowers the potential barrier for hole injection from the other electrode closer to the other p++ region. By symmetry, the same behavior would be seen if the opposite voltage polarity is applied across the p++/n+/p++ diode.

Figure 13B:
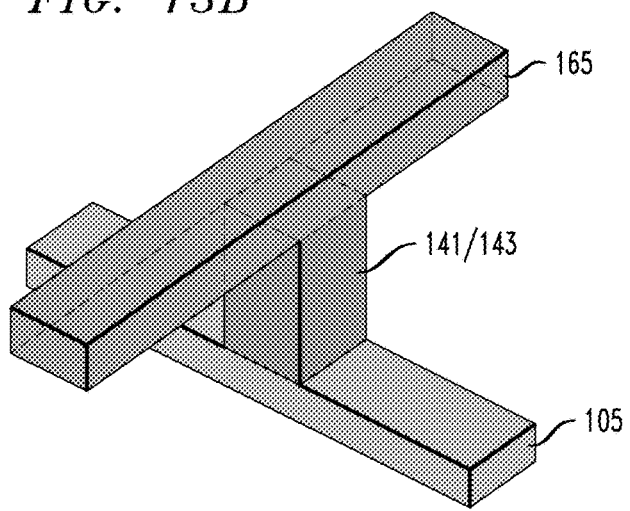
FIG. 13B is a three-dimensional schematic diagram of a memory cell including a bitline on top and a wordline on a bottom of the memory cell, according to an embodiment of the invention.

FIG. 13B is a three-dimensional schematic diagram of a memory cell including a bitline on top and a wordline on a bottom of the memory cell, according to an embodiment of the invention. Referring to FIG. 13B, the memory cell includes the memory element 141 and the selection element 143 between a bitline 165 and a wordline 105 in a cross-point configuration.

Figure 14A:
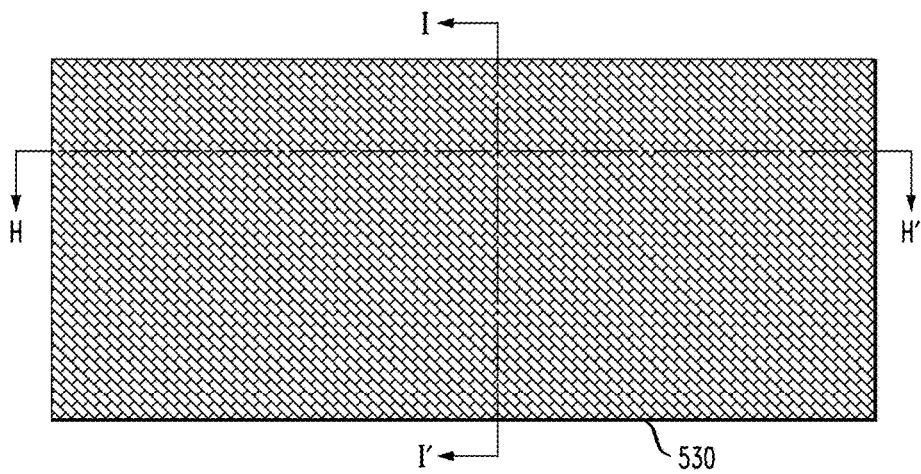
FIG. 14A is a schematic top view illustrating manufacturing of a memory device and showing formation of an a-Si layer on a stacked structure of doped polysilicon layers on a wordline layer, according to an embodiment of the invention.
Figure 14B:
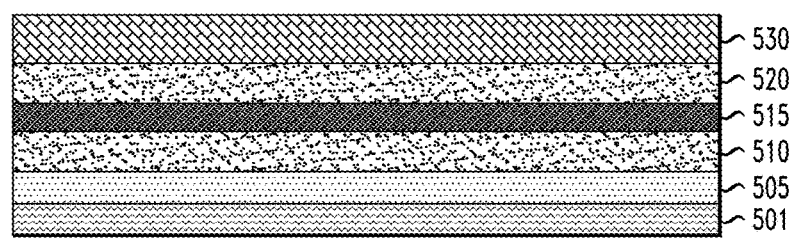
FIGS. 14B and 14C are schematic cross-sectional views taken along the lines H-H' and I-I' in FIG. 14A and showing formation of an a-Si layer on a stacked structure of doped polysilicon layers on a wordline layer, according to an embodiment of the invention.
Figure 14C:
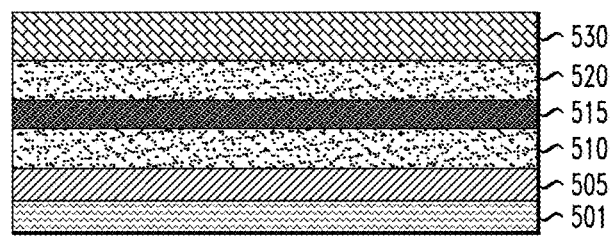
Figure 14D:
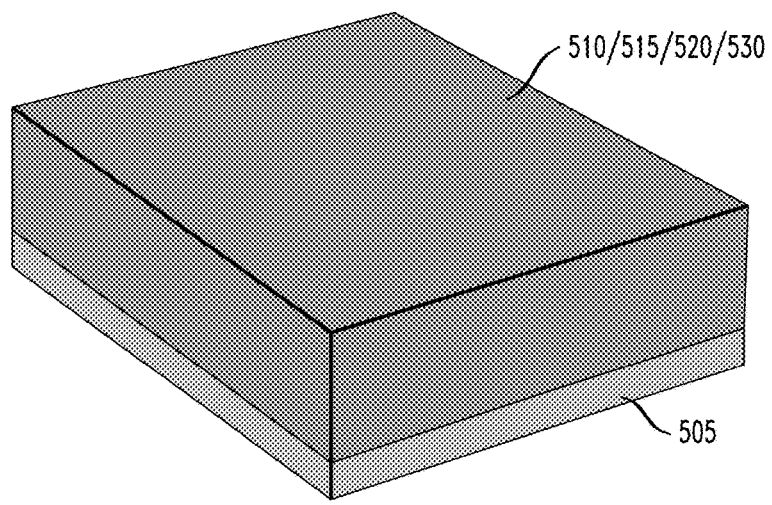
FIG. 14D is a schematic three-dimensional view showing formation of an a-Si layer on a stacked structure of doped polysilicon layers on a wordline layer, according to an embodiment of the invention.

FIG. 14A is a schematic top view, FIGS. 14B and 14C are schematic cross-sectional views taken along the lines H-H' and I-I' in FIG. 14A, and FIG. 14D is a schematic three-dimensional view illustrating manufacturing of a memory device and showing formation of an a-Si layer on a stacked structure of doped polysilicon layers on a wordline layer, according to an embodiment of the invention. The processing prior to what is shown in FIGS. 14A-14D is similar to that described in connection with FIGS. 1A-6B, except that in connection with the device 500, up to this point in the process flow, there is no patterning of the wordline layer 505 into separate portions as shown in FIG. 1A. Instead, as can be seen in the three-dimensional view in FIG. 14D, the wordline layer 505 remains as a whole portion, and referring to FIGS. 14B-14D, the layers 510, 515, 520 and 530 on the wordline layer 505 are deposited on the whole wordline layer 505 (e.g., blanket deposition). The material of the wordline layer 505 can include an electrically conductive material, such as, but not necessarily limited to, the materials noted in connection with the wordlines 105. The three-dimensional views in FIGS. 14D, 15D, 15D, 17D, 18D and 19D depict the layers 510, 515, 520 and 530 as a single block and do not show the underlying dielectric layer 501.

Referring to FIGS. 14A-14D, an a-Si layer 530 is formed on the upper polysilicon layer 520 of the stack including the polysilicon layers 510, 515 and 520. In accordance with an embodiment of the present invention, a thickness (e.g., height with respect to the underlying layer) of the a-Si layer 530 can be approximately 3 nm-25 nm, but thicker or thinner layers may also be used. The a-Si layer 530 can be deposited using, for example CVD, PECVD, RFCVD, HWCVD, PVD, ALD, MLD, MBD, PLD, LSMCD, and/or sputtering.

Figure 15A:
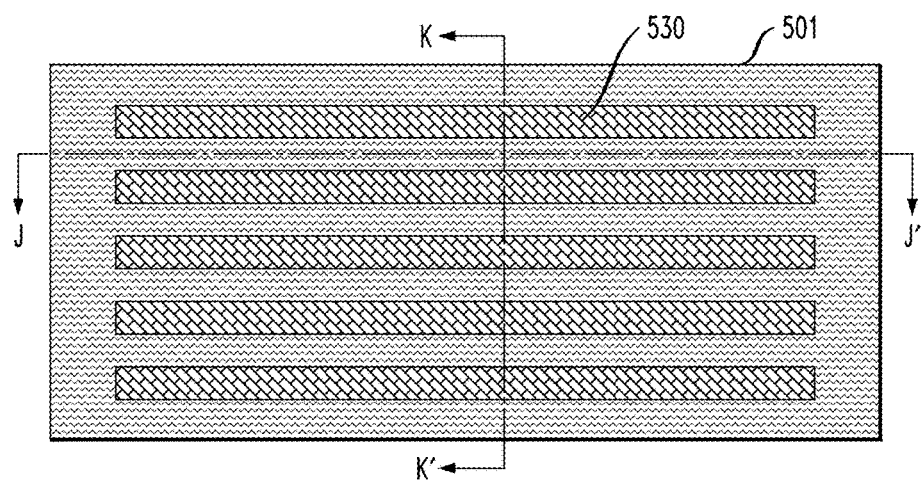
FIG. 15A is a schematic top view illustrating manufacturing of a memory device and showing patterning of the stacked a-Si, polysilicon and wordline layers into pillars on a dielectric layer, according to an embodiment of the invention.
Figure 15B:
FIGS. 15B and 15C are schematic cross-sectional views taken along the lines J-J' and K-K' in FIG. 15A and showing patterning of the stacked a-Si, polysilicon and wordline layers into pillars on a dielectric layer, according to an embodiment of the invention.
Figure 15C:
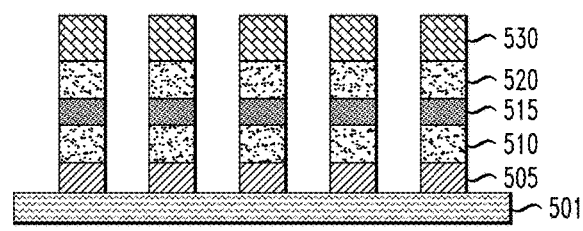
Figure 15D:
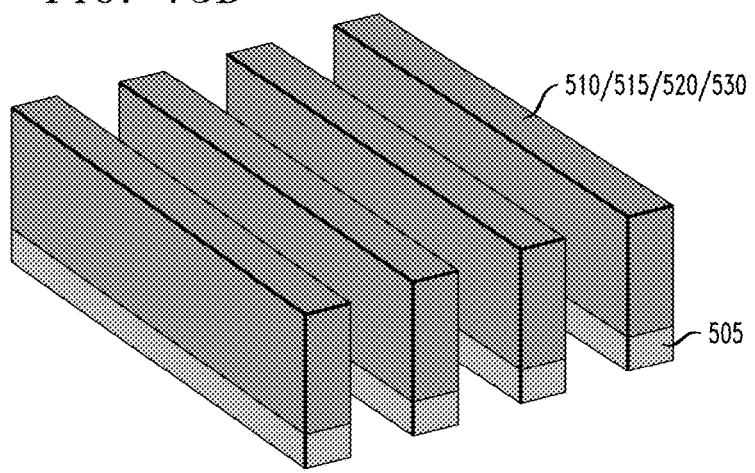
FIG. 15D is a schematic three-dimensional view showing patterning of the stacked a-Si, polysilicon and wordline layers into pillars, according to an embodiment of the invention.

FIG. 15A is a schematic top view, FIGS. 15B and 15C are schematic cross-sectional views taken along the lines J-J' and K-K' in FIG. 15A, and FIG. 15D is a schematic three-dimensional view illustrating patterning of the stacked a-Si, polysilicon and wordline layers into pillars, according to an embodiment of the invention. Referring to FIGS. 15A-15D, the stacks including the a-Si layer 530 on the stacked polysilicon layers 510, 515 and 520 are patterned using an etching process, such as, for example, reactive ion etching (ME) to result in pillar/columnar structures spaced apart from each other on the dielectric layer 501, each columnar structure including layers 530, 520, 515 and 110, and a wordline 505 in descending order. In accordance with an embodiment of the present invention, the layers 530, 520, 515 and 110, and the wordline layer 505 are patterned using the same mask. As can be understood, the according to an embodiment, the polysilicon layers 510, 515 and 520 are $p^{++}$, $n^+$ and $p^{++}$ doped (or $p^+$, n and $p^+$ doped), respectively. Alternatively, the polysilicon layers 510, 515 and 520 are $n^{++}$, $p^+$ and $n^{++}$ doped (or $n^+$, p and $n^+$ doped), respectively. In one example, where the wordline 505 is comprised of tungsten, the etch can be performed using reactive ion-etching, for example, in a $SF_6/CHF_3$ plasma to etch the a-Si/polysilicon layers 510/515/520/530 and the wordline 505 and stop on dielectric 501. In this example, an appropriate hard mask such as silicon nitride may be formed on the a-Si layer 130 in order to mask portions of the stacked structures including layers 530, 520, 515, 510 and 505 not being etched, and expose remaining portions of the stacked structures that are to be etched. In another example, where the wordline 505 is comprised of TiN, an inductively coupled plasma etch in a $HBr/He/O_2$ plasma, $N_2/BCl_3/Ar$ plasma, or $CF_4/Ar$ plasma and a silicon-nitride hard mask may be used.

Figure 16A:
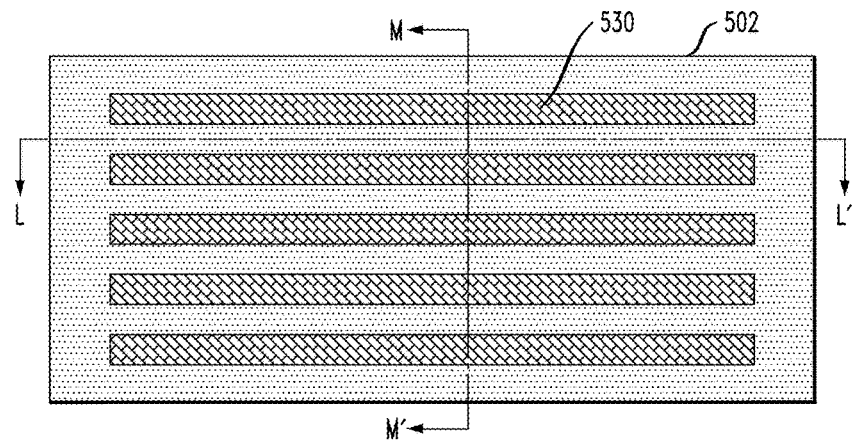
FIG. 16A is a schematic top view illustrating manufacturing of a memory device and showing dielectric deposition and planarization on the structure from FIGS. 15A-15D, according to an embodiment of the invention.
Figure 16B:
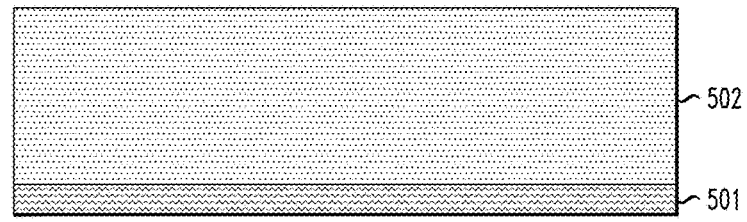
FIGS. 16B and 16C are schematic cross-sectional views taken along the lines L-L' and M-M' in FIG. 16A and showing dielectric deposition and planarization on the structure from FIGS. 15A-15D, according to an embodiment of the invention.
Figure 16C:
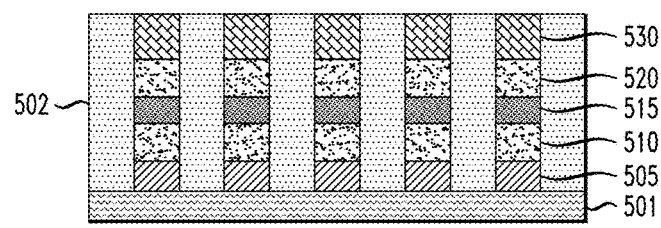
Figure 16D:
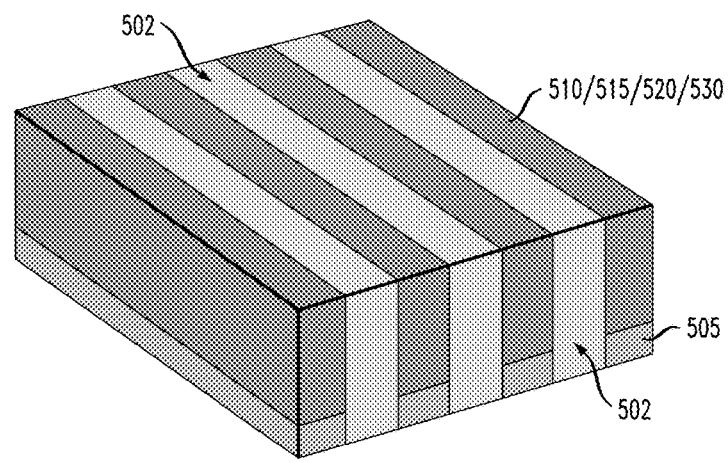
FIG. 16D is a schematic three-dimensional view showing dielectric deposition and planarization on the structure from FIGS. 15A-15D, according to an embodiment of the invention.

FIG. 16A is a schematic top view, FIGS. 16B and 16C are schematic cross-sectional views taken along the lines L-L' and M-M' in FIG. 16A, and FIG. 16D is a schematic three-dimensional view showing dielectric deposition and planarization on the structure from FIGS. 15A-15D, according to an embodiment of the invention. Referring to FIGS. 16A-16C, another dielectric layer 502 is formed on the dielectric layer 501 and in the spaces between the patterned stacked structures including the layers 505, 510, 515, 520 and 530. The material of the dielectric layer 502 can include, but is not necessarily limited to, a low-K dielectric material, such as, for example, silicon oxide, silicon nitride, silicon oxynitride, boron nitride, and/or silicon boron nitride. The dielectric layer 502 is deposited using deposition techniques such as, for example, CVD, PECVD, RFCVD, PVD, ALD, MBD, PLD, and/or LSMCD, and/or sputtering, which may be followed by a planarization process, such as, CMP, to remove excess portions of the layer 502 after deposition, and planarize the layer 502 to be coplanar with the a-Si layers 530 at the top of the stacked structures.

Figure 17A:
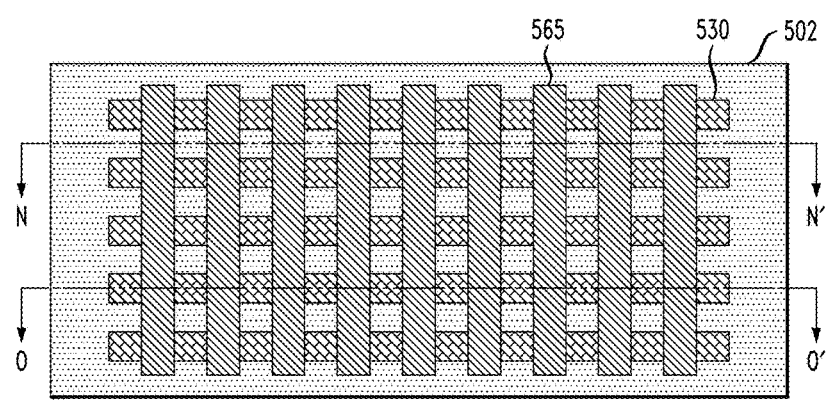
FIG. 17A is a schematic top view illustrating manufacturing of a memory device and showing bitline formation on the structure formed in connection with FIGS. 16A-16D, according to an embodiment of the invention.
Figure 17B:
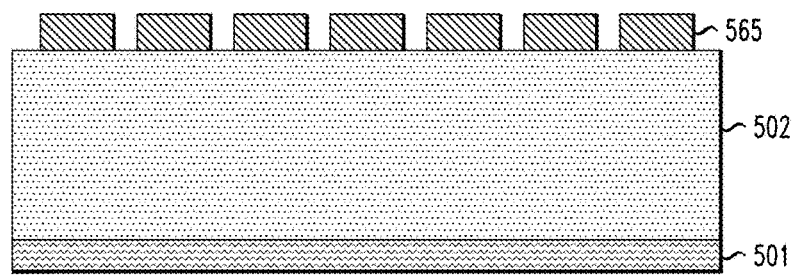
FIGS. 17B and 17C are schematic cross-sectional views taken along the lines N-N' and O-O' in FIG. 17A and showing bitline formation on the structure formed in connection with FIGS. 16A-16D, according to an embodiment of the invention.
Figure 17C:
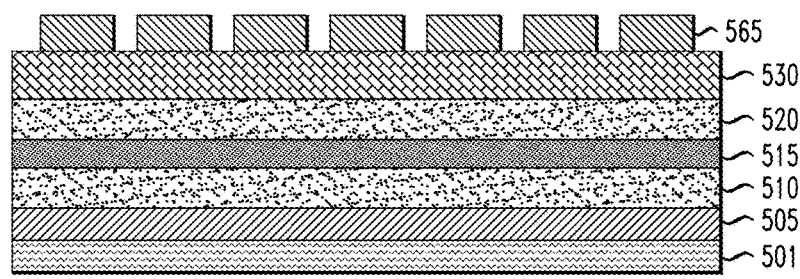
Figure 17D:
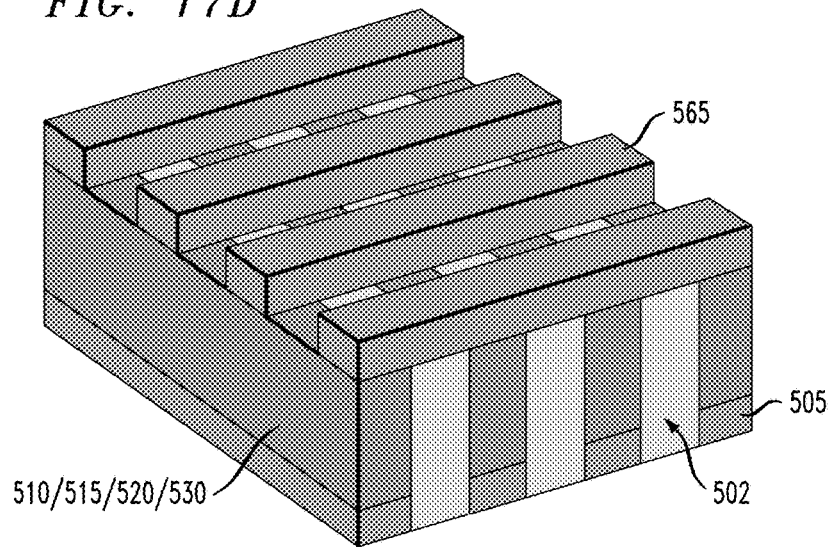
FIG. 17D is a schematic three-dimensional view showing bitline formation on the structure formed in connection with FIGS. 16A-16D, according to an embodiment of the invention.

FIG. 17A is a schematic top view, FIGS. 17B and 17C are schematic cross-sectional views taken along the lines N-N' and O-O' in FIG. 17A, and FIG. 17D is a schematic three-dimensional view showing bitline formation on the structure formed in connection with FIGS. 16A-16D, according to an embodiment of the invention. Referring to FIGS. 17A-17D, a plurality of bitlines 565 are formed on the dielectric layer 502 to be spaced apart from each other in positions on the stacked structures including layers 530, 520, 515, 510 and 505. The bitlines 565 electrically contact their corresponding a-Si layers 530, and the wordlines 505 electrically contact the polysilicon layers 110. The bitlines 565 are oriented to have a length (longer dimension) extension direction which is perpendicular to the length (longer dimension) extension direction of the wordlines 505.

The material of the bitlines 565 can include an electrically conductive material, such as, but not necessarily limited to, tungsten, cobalt, zirconium, tantalum, titanium, aluminum, ruthenium, copper, silver, metal carbides (e.g., tantalum carbide, titanium carbide, tantalum magnesium carbide), metal nitrides (e.g., titanium nitride), transition metal aluminides or combinations thereof. The bitlines 165 can be deposited using, for example, CVD, PECVD, RFCVD, PVD, ALD, MLD, MBD, PLD, LSMCD, and/or sputtering, followed by planarization by, for example, CMP. In accordance with an embodiment of the present invention, a whole bitline layer is deposited and then patterned into individual portions that are spaced apart from each other. The bitlines 565 can be patterned to be spaced apart from each other, using, for example, photolithography and reactive ion etching (ME), which may optionally include a dielectric hard mask, such as oxide or nitride.

Figure 18A:
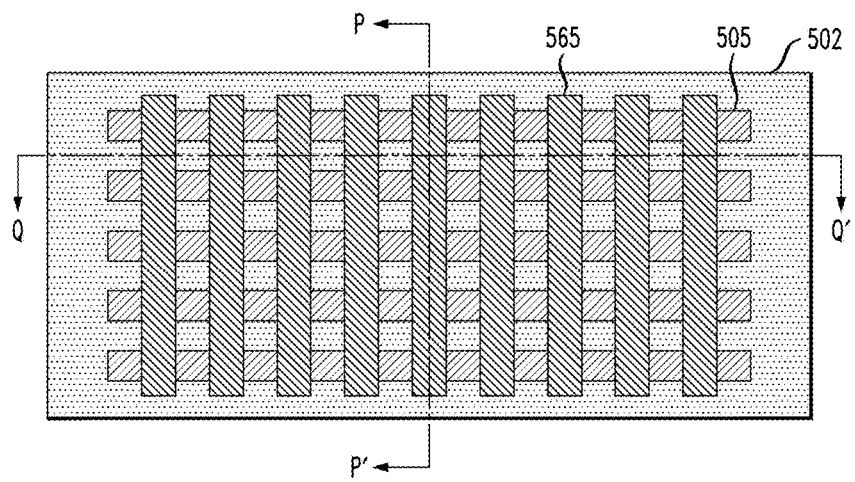
FIG. 18A is a schematic top view illustrating manufacturing of a memory device and showing removal of exposed portions of a-Si and polysilicon layers, according to an embodiment of the invention.
Figure 18B:
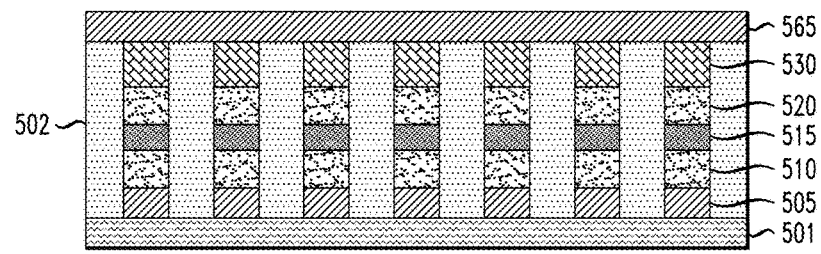
FIGS. 18B and 18C are schematic cross-sectional views taken along the lines P-P' and Q-Q' in FIG. 18A and showing removal of exposed portions of a-Si and polysilicon layers, according to an embodiment of the invention.
Figure 18C:
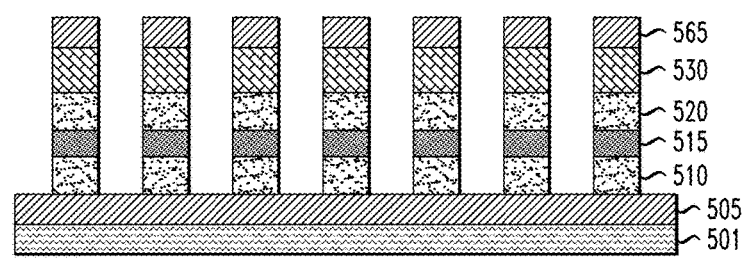
Figure 18D:
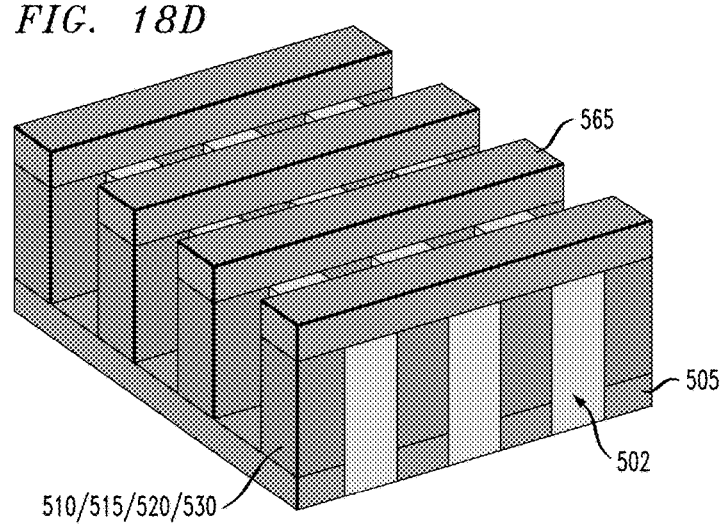
FIG. 18D is a schematic three-dimensional view showing removal of exposed portions of a-Si and polysilicon layers, according to an embodiment of the invention.

FIG. 18A is a schematic top view, FIGS. 18B and 18C are schematic cross-sectional views taken along the lines P-P' and Q-Q' in FIG. 18A, and FIG. 18D is a schematic three-dimensional view showing removal of exposed portions of a-Si and polysilicon layers, according to an embodiment of the invention. Referring to FIGS. 18A-18D, exposed portions of a-Si and polysilicon layers 530, 520, 515 and 510 not covered by the bitlines 565 are removed down to the wordlines 505. In one example where the wordline 505 is comprised of TiN, the removal can be performed by, for example, a reactive ion etching process using a $SF_6/O_2$ plasma or $CF_4$ plasma. The portions covered by the bitlines 565 remain.

Figure 19A:
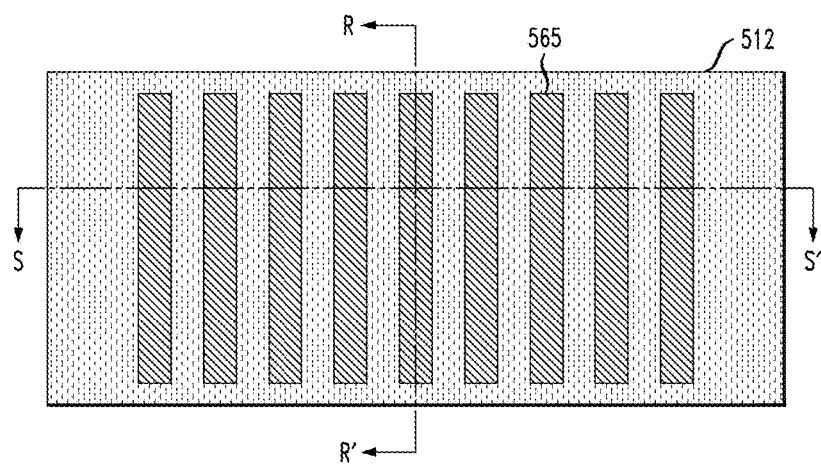
FIG. 19A is a schematic top view illustrating manufacturing of a memory device and showing dielectric deposition and planarization on the structure from FIGS. 18A-18D, according to an embodiment of the invention.
Figure 19B:
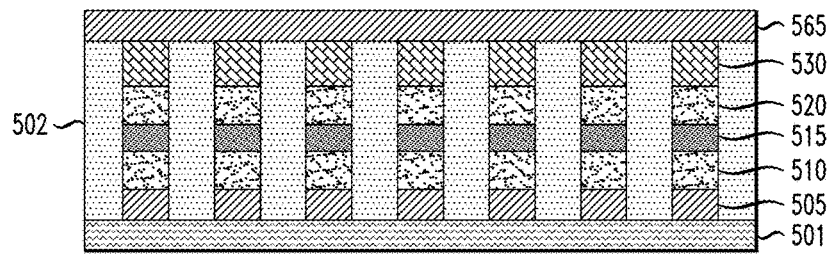
FIGS. 19B and 19C are schematic cross-sectional views taken along the lines R-R' and S-S' in FIG. 19A and showing dielectric deposition and planarization on the structure from FIGS. 18A-18D, according to an embodiment of the invention.
Figure 19C:
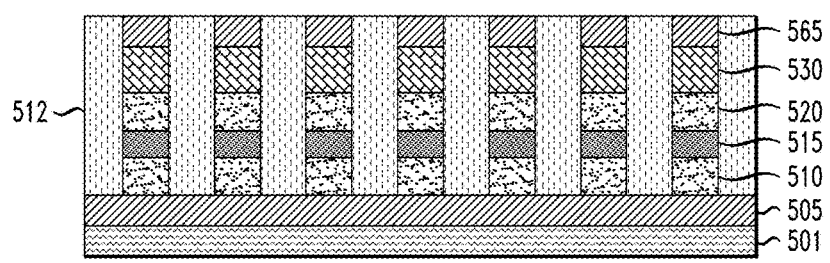
Figure 19D:
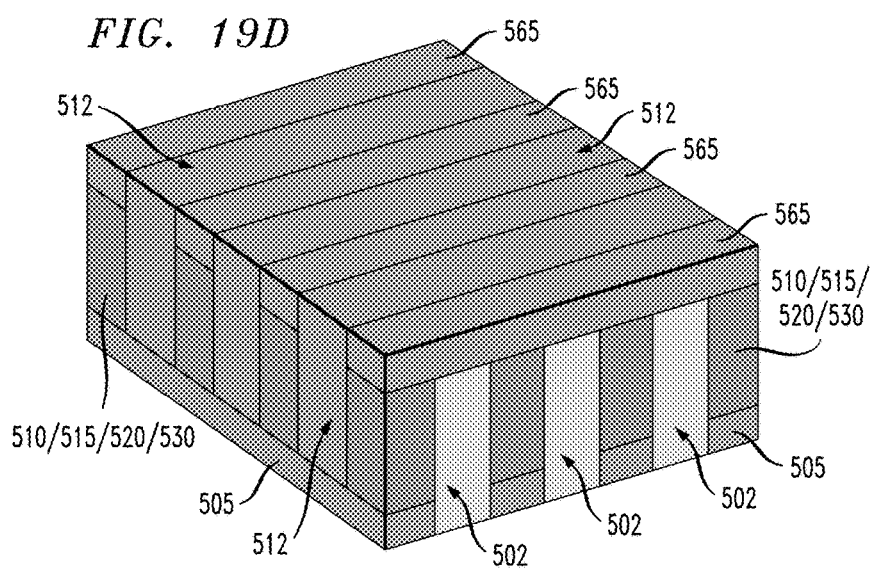
FIG. 19D is a schematic three-dimensional view showing dielectric deposition and planarization on the structure from FIGS. 18A-18D, according to an embodiment of the invention.

FIG. 19A is a schematic top view, FIGS. 19B and 19C are schematic cross-sectional views taken along the lines R-R' and S-S' in FIG. 19A, and FIG. 19D is a schematic three-dimensional view showing dielectric deposition and planarization on the structure from FIGS. 18A-18D, according to an embodiment of the invention. Referring to FIGS. 19A-19D, another dielectric layer 512 is formed in the spaces left by the removal of the exposed portions of a-Si and polysilicon layers 530, 520, 515 and 510. The dielectric layer 512 is formed on the wordlines 505 and on portions of the dielectric layer 502 between the wordlines 505. The material of the dielectric layer 512 can include, but is not necessarily limited to, a low-K dielectric material, such as, for example, silicon oxide, silicon nitride, silicon oxynitride, boron nitride, and/or silicon boron nitride. The dielectric layer 512 is deposited using deposition techniques such as, for example, CVD, PECVD, RFCVD, PVD, ALD, MBD, PLD, and/or LSMCD, and/or sputtering, which is followed by a planarization process, such as, CMP, to remove excess portions of the layer 512 after deposition, and planarize the layer 512 to be coplanar with the top surfaces of the bitlines 565.

In accordance with an embodiment of the present invention, the device 500 formed in connection with FIGS. 14A-19D is a resistive memory device (e.g. RRAM) configured in a cross-bar (cross-point) structure, including resistive memory elements comprising the a-Si layers 530 coupled to bipolar (bidirectional) diodes (i.e. selection elements) comprising the $p^{++}$, $n^+$ and $p^{++}$ (or $p^+$, n and $p^+$) polysilicon layers 510, 515 and 520. The memory cells comprised of memory elements and diodes are interposed between top electrodes (e.g., bitlines 565) and bottom electrodes (e.g. wordlines 505) in a cross-bar structure. Multiple cross-bar structures comprised of wordlines, memory cells and wordlines as described above may be stacked on top of each other, thus forming a 3D stacked cross-bar structure. Each of the cross-bar structures comprising the 3D stacked cross-bar structure may be fabricated using the fabrication processes as described above with reference to the cross-bar structure 500.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor memory device, comprising:
    forming a first silicon layer on a bottom conductive layer;
    transforming the first silicon layer into a first polysilicon layer;
    forming a second silicon layer stacked on the first polysilicon layer, and a third silicon layer stacked on the second silicon layer;
    transforming the second and third silicon layers into second and third polysilicon layers;
    wherein the first and third polysilicon layers have a first doping type, and the second polysilicon layer has a second doping type different from the first doping type;
    forming an amorphous silicon layer on the third polysilicon layer; and
    forming a top conductive layer on the amorphous silicon layer.

2. The method according to claim 1, wherein the transforming of the first, second and third silicon layers is performed at a temperature less than 400° C.

3. The method according to claim 1, wherein the transforming of the first, second and third silicon layers is performed using a laser annealing process.

4. The method according to claim 1, wherein the first, second and third silicon layers comprise at least one of amorphous silicon, nano-crystalline silicon and micro-crystalline silicon.

5. The method according to claim 1, further comprising planarizing the first polysilicon layer in order to remove one or more surface protrusions formed on the first polysilicon layer as a result of the transforming of the first silicon layer.

6. The method according to claim 1, wherein forming the second and third silicon layers comprises epitaxially growing the second and third silicon layers.

7. The method according to claim 1, further comprising patterning a stacked structure of the amorphous silicon layer on the first, second and third polysilicon layers into a plurality of stacked structures spaced apart from each other on the bottom conductive layer.

8. The method according to claim 7, further comprising depositing a dielectric layer on the bottom conductive layer between the plurality of stacked structures.

9. The method according to claim 1, further comprising:
    patterning the bottom conductive layer into a plurality of wordlines;
    patterning the top conductive layer into a plurality of bitlines;
    wherein the plurality of bitlines are oriented perpendicularly with respect to the plurality of wordlines.

10. The method according to claim 1, further comprising patterning a stacked structure of the amorphous silicon layer and the first, second and third polysilicon layers on the bottom conductive layer into a plurality of stacked structures spaced apart from each other.

11. The method according to claim 10, further comprising depositing a dielectric layer between the plurality of stacked structures.

12. The method according to claim 11, further comprising patterning the top conductive layer into a plurality of bitlines, wherein the plurality of bitlines cover first portions of the plurality of stacked structures, and remaining portions of the plurality of stacked structures not covered by the plurality of bitlines are exposed.

13. The method according to claim 12, further comprising removing the remaining portions of the plurality of stacked structures down to the bottom conductive layer.

14. The method according to claim 13, further comprising depositing another dielectric layer in spaces left by the removal of the remaining portions of the plurality of stacked structures.

15. A method for manufacturing a semiconductor memory device, comprising:
- forming a first silicon layer on a bottom conductive layer;
- crystallizing the first silicon layer;
- forming a second silicon layer stacked on the crystallized first silicon layer, and a third silicon layer stacked on the second silicon layer;
- crystallizing the second and third silicon layers;
- wherein the crystallized first and third silicon layers have a first doping type, and the crystallized second silicon layer has a second doping type different from the first doping type;
- forming an amorphous silicon layer on the crystallized third silicon layer; and
- forming a top conductive layer on the amorphous silicon layer.

16. The method according to claim 15, wherein the crystallizing of the first, second and third silicon layers is performed at a temperature less than 400° C.

* * * * *